(12) United States Patent
Bertoni et al.

(10) Patent No.: US 11,504,882 B2
(45) Date of Patent: Nov. 22, 2022

(54) SOUND-ASSISTED CRACK PROPAGATION FOR SEMICONDUCTOR WAFERING

(71) Applicant: ARIZONA BOARD OF REGENTS ON BEHALF OF ARIZONA STATE UNIVERSITY, Scottsdale, AZ (US)

(72) Inventors: Mariana Bertoni, Mesa, AZ (US); Pablo Guimera Coll, Overland Park, KS (US)

(73) Assignee: ARIZONA BOARD OF REGENTS ON BEHALF OF ARIZONA STATE UNIVERSITY, Scottsdale, AZ (US)

( * ) Notice: Subject to any disclaimer, the term of this patent is extended or adjusted under 35 U.S.C. 154(b) by 20 days.

(21) Appl. No.: 17/094,524

(22) Filed: Nov. 10, 2020

(65) Prior Publication Data
US 2021/0053251 A1 Feb. 25, 2021

Related U.S. Application Data

(63) Continuation of application No. 16/083,276, filed as application No. PCT/US2017/021418 on Mar. 8, 2017, now Pat. No. 10,828,800.
(Continued)

(51) Int. Cl.
*H01L 21/00* (2006.01)
*B28D 5/04* (2006.01)
(Continued)

(52) U.S. Cl.
CPC .............. *B28D 5/047* (2013.01); *B26D 7/086* (2013.01); *B26F 3/002* (2013.01); *C03B 33/033* (2013.01);
(Continued)

(58) Field of Classification Search
CPC ......... B28D 5/047; B26D 7/086; B26F 3/002; C03B 33/033; G01N 29/045; H01L 21/02002; H01L 21/78
See application file for complete search history.

(56) References Cited

U.S. PATENT DOCUMENTS 7,056,808 B2 6/2006 Henley et al.
8,389,999 B2 3/2013 Buonassisi et al.
(Continued)

FOREIGN PATENT DOCUMENTS

JP 0224100 A 1/1990
WO WO2007087354 A2 8/2007
(Continued)

OTHER PUBLICATIONS

Japanese Patent Office Action for Application No. 2018-547922 dated Jun. 8, 2021 (10 pages, English translation ncluded).
(Continued)

*Primary Examiner* — Richard A Booth
(74) *Attorney, Agent, or Firm* — Michael Best & Friedrich LLP

(57) ABSTRACT

Systems and methods are described for controlled crack propagation in a material using ultrasonic waves. A first stress in applied to the material such that the first stress is below a critical point of the material and is insufficient to initiate cracking of the material. A controlled ultrasound wave is then applied to the material causing the total stress applied at a crack tip in the material to exceed the critical point. In some implementations, the controlled cracking is used for wafering of a material.

17 Claims, 5 Drawing Sheets

Related U.S. Application Data

(60) Provisional application No. 62/305,399, filed on Mar. 8, 2016.

(51) Int. Cl.
  *C03B 33/033* (2006.01)
  *G01N 29/04* (2006.01)
  *B26D 7/08* (2006.01)
  *B26F 3/00* (2006.01)
  *H01L 21/02* (2006.01)
  *H01L 21/78* (2006.01)

(52) U.S. Cl.
  CPC .......... *G01N 29/04* (2013.01); *G01N 29/045* (2013.01); *H01L 21/02002* (2013.01); *H01L 21/78* (2013.01)

(56) References Cited

U.S. PATENT DOCUMENTS

| | | | |
|---|---|---|---|
| 8,450,704 B2 | 5/2013 | Buonassisi et al. | |
| 9,257,339 B2 | 2/2016 | Henley et al. | |
| 10,828,800 B2 * | 11/2020 | Bertoni | B26F 3/002 |
| 2006/0249553 A1 | 11/2006 | Ukrainczyk | |
| 2007/0281445 A1 | 12/2007 | Nguyen et al. | |
| 2009/0277314 A1 | 11/2009 | Henley | |
| 2010/0052105 A1 | 3/2010 | Henley et al. | |
| 2010/0055874 A1 | 3/2010 | Henley | |
| 2010/0327181 A1 | 12/2010 | Ryding et al. | |
| 2013/0240591 A1 | 9/2013 | Cox et al. | |
| 2013/0344684 A1 | 12/2013 | Bowden | |
| 2015/0101744 A1 | 4/2015 | George et al. | |
| 2015/0155422 A1 | 6/2015 | Henley et al. | |
| 2020/0147966 A1 | 5/2020 | Bertoni et al. | |

FOREIGN PATENT DOCUMENTS

| | | |
|---|---|---|
| WO | WO2014186999 A1 | 11/2014 |
| WO | WO2018213640 A1 | 11/2018 |

OTHER PUBLICATIONS

Arenas et al., "Recent Trends in Porous Sound-Absorbing Materials," Sound and Vibration, July (2010).

Bedell et al. "Kerf-Less Removal of Si, Ge, and lll-V Layers by Controlled Spalling to Enable Low-Cost PV Technologies", IEEE J. of Photovoltaics, vol. 2 (2), 2012.

Boudet et al., "Interaction of sound with fast crack propagation: An equation of motion for the crack tip," Physica D 142 (2000) 317-345.

Boudet et al., "Interaction of sound with fast crack propagation", Phys. Rev. Let., vol. 80, (2), 341-344, 1998.

Dross et al., "Stress-induced large-area lift-off of crystalline Si films", Applied Physics A: Materials Science & Processing, vol. 89, 149-152, 2007.

Henley et al., "Beam-induced watering technology for kerf-free thin PV manufacturing", in: 34th IEEE Photovoltaic Specialists Conference, 001718-001723, 2009.

Henley, F., "Kerf-less wafer production", Mar. 2009, Photon's 4th PV Production Equipment Conference, 37 slides.

Islam et al., "Non-Destructive Inspection of Multiple Concrete Cracks Using Ultrasonic Sensor," SICE-ICASE International Joint Conference (2006).

Koch et al., "Bulk Crystal Growth and Watering for PV", in: Luque, A. and Hegedus S. (eds), "Handbook of Photovoltaic Science and Engineering" (West Sussex, John Wiley & Sons Ltd., 2003), pp. 205-254.

Martini et al. "Epoxy-induced spalling of Silicon," Energy Procedia 00 (2011) 000-000.

Rao, et al. "A Novel Low Cost 25um Thin Exfoliated Monocrystalline Si Solar Cell Technology", in: 37th IEEE Photovoltaic Specialists Conference, 2011.

Schoenfelder et al., "Kerfless watering for silicon wafers by using a reusable metal layer" Energy Procedia, vol. 38, 942 - 949 (2013).

Serra et al., "Room temperature spalling of thin silicon foils using a kerfless technique," Energy Procedia 55 ( 2014 ) 873 - 878.

Wesoff, E., "AstroWatt Speaks About Its Ultra Thin Silicon Solar Cells" [online], Greentech Media, Oct. 2011 [retrieved 2013-08-30], retrieved from the internet: <URL: http://www.greentechmedia.com/articles/read/AstroWatt-Speaks-About-its-Ultra-Thin-Silicon-Solar-Cells/>.

European Patent Office Extended Search Report for Application No. 17764024.0 dated Sep. 11, 2019 (8 pages).

International Search Report and Written Opinion for Application No. PCT/US2017/021418 dated May 26, 2017, 14 pages.

\* cited by examiner

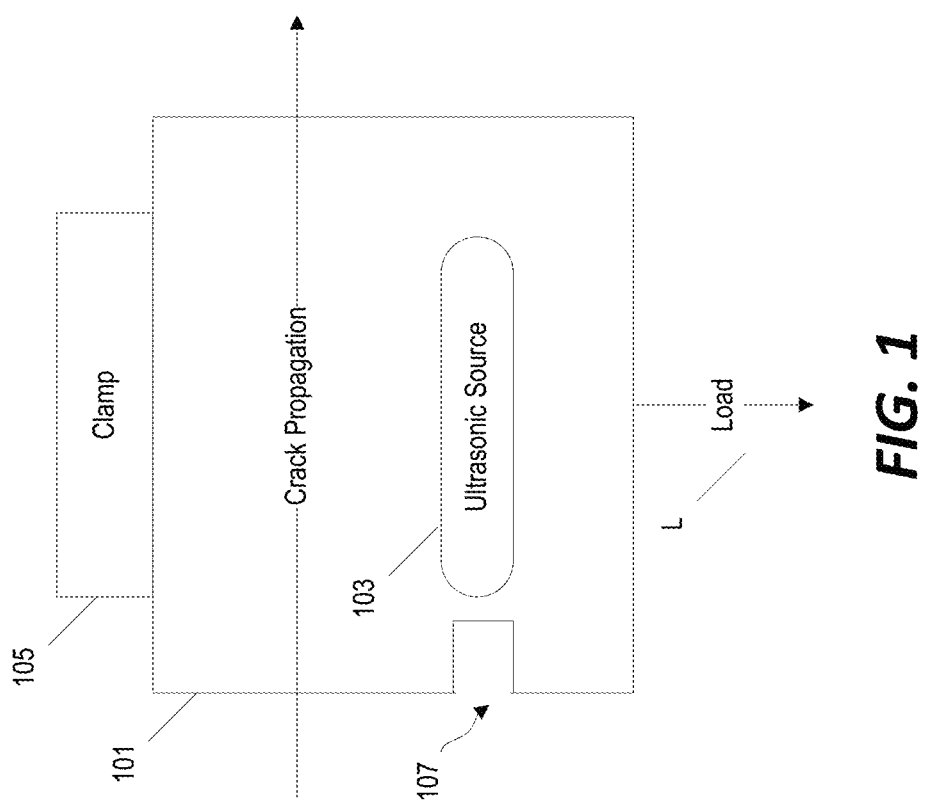

SOUND-ASSISTED CRACK PROPAGATION FOR SEMICONDUCTOR WAFERING

RELATED APPLICATIONS

This application is a continuation of U.S. patent application Ser. No. 16/083,276, filed on Sep. 7, 2018, which is a 35 U.S.C. § 371 national phase application of PCT Application No. PCT/US2017/021418, filed on Mar. 8, 2017, which claims the benefit of U.S. Provisional Application No. 62/305,399, filed Mar. 8, 2016, entitled "SOUND-ASSISTED CRACK PROPAGATION FOR SEMICONDUCTOR WAFERING," the entire contents of each application being incorporated herein by reference.

BACKGROUND

The present invention relates to systems and methods for "wafering" or cutting materials such as silicon or glass for electronic, photovoltaic, or other uses.

In photovoltaics, thirty-five percent of silicon module costs come from wafer manufacturing, and two-thirds of those costs are directly related to the process of wafering and silicon feedstock yield. The standard technique for wafer cutting uses a wire saw set with an abrasive material that wears away the silicon under the wires. The typical production involves 160-180 μm wafers with 120 μm wire—so the material loss, also known as kerf-loss, can be up to the thickness of the wafers. Besides the loss of material other undesirable wafer characteristics are obtained with this method such as thickness variations, warp, or saw marks.

Different "kerfless" techniques have been proposed as alternatives for the sawing technology. Some of the proposed solutions have involved conducting crystal growth directly in wafer form. The main disadvantages with this technology are the lack of control of the crystal structure or defects and the lack of the inherent advantage of impurity segregation present in bulk crystal growth.

Spalling is another alternative kerfless technology in silicon which capitalizes on the crystalline and mechanical properties of silicon since it has well defined crystal planes and it is an ideal brittle solid through which cracks can propagate easily. However, this technology carries several difficulties for industrial applications. In the case of some harder materials such as sapphire, its structure and mechanical properties make spalling an unfeasible option as a wafering technique. For semiconductors wafering, there are some severe problems related to the quality and efficiency of the wafers produced by spalling.

Another disadvantage in this process is the high temperatures used to produce the cleaved wafer. In some experiments, the substrate needs to be heat up till 600-800 C in order to be able to activate the spalling mechanism upon cooling. That range of temperature degrades the properties of the substrate through defects and diffusion of species inside the silicon bulk.

In those experiments performed at lower temperatures, the lifetime of the carriers in spalled wafers is much lower compared to the original substrate. Also, the surface of the produced wafers is not regular and could lead to a total thickness variation of 100% with respect of the wafer thickness. These irregularities, where both cleaved wafer and parent substrate show rough surfaces, will cause a lower efficiency in the final cell performance.

SUMMARY

A revolutionary process for cutting silicon that eliminates slurry and wires while doubling the yield of a silicon ingot could become a disruptive technology and make solar energy more competitive with other fossil fuel technologies. Along with photovoltaics, this technology will open a new market for those technologies that manufacture wafers or thin films with the current slurry or wire sawing techniques.

However, some alternatives to the current sawing technique have too many difficulties to become that disruptive technology that could wafer any kind of material at a low cost. Specifically, in the spalling technique, the main problem relies on the total lack of control of crack propagation that derives in low quality surfaces and the inability to wafer hard materials such as sapphire.

The success of these kerfless wafering techniques relies on the control of the crack propagation through the material. The systems and methods describes below provide kerfless cleaving of a wafer from a substrate by using ultrasound to control the propagation of an premade crack.

In one embodiment, the invention provides a method of wafering a material using controlled crack propagation. A first stress in applied to the material such that the first stress is below a critical point of the material and is insufficient to initiate cracking of the material. A controlled ultrasound wave is then applied to the material causing the total stress applied at a crack tip in the material to exceed the critical point.

In some embodiments, the frequency and/or amplitude of the controlled ultrasound wave is adjusted to maintain a substantially constant and relatively low crack velocity. In other embodiments, applying the controlled ultrasound wave includes applying a first ultrasound wave at a first frequency and applying a second ultrasound wave at a second frequency. Neither wave alone generates enough stress at the crack tip to propagate cracking of the material. However, the two waves are controlled such that, when they periodically align and are applied to the crack tip of the material in phase, the resulting stress is sufficient to propagate cracking of the material.

Other aspects of the invention will become apparent by consideration of the detailed description and accompanying drawings.

BRIEF DESCRIPTION OF THE DRAWINGS

FIG. 1 is a schematic view of a system for ultrasound-induced crack propagation according to one embodiment.

DETAILED DESCRIPTION

Figure 3:
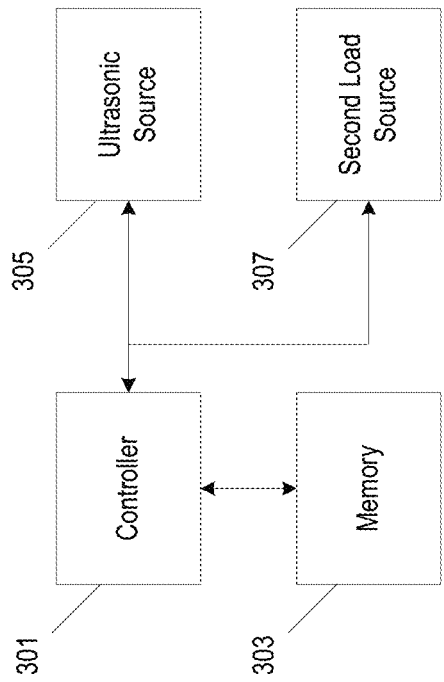
FIG. 3 is a block diagram of a control system for implementing the method of FIG. 2 in the system of FIG. 1.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

FIG. 1 illustrates a system for controlled crack propagation in a material 101 (e.g., a glass piece/sheet) using an ultrasonic source 103. A clamp 105 is positioned to hold a glass piece/sheet 101 (1 m×1 m×0.7 m; E=65 GPa; y–0.2 J/m$^2$) in place. An ultrasound source 103 is positioned to induce stress at a crack tip 107 to propagate the crack through the glass sheet. A load L is also applied to the glass sheet in a direction perpendicular to that of the ultrasonic source 103.

Figure 2:
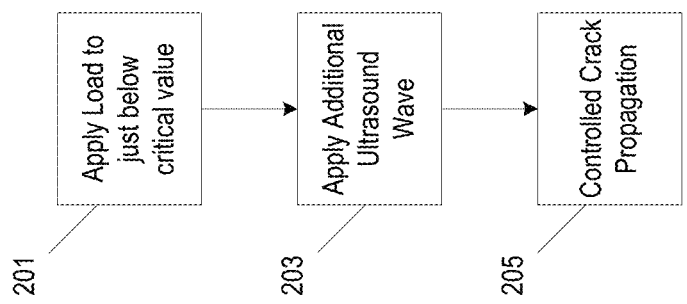
FIG. 2 is a flowchart of a method for ultrasound-induced crack propagation using the system of FIG. 1.

FIG. 2 illustrates a method for controlling propagation of the crack through the glass in the example of FIG. 1. A slow velocity of the propagating crack is desired since, at high velocities, the crack becomes unstable. This instability can lead to deviations of the crack trajectory with the consequent branching and corrugation of the surface. In order to propagate a "slow crack," an initial load L is applied to the glass 101 such that the resultant stress at the crack tip 107 is just below the critical value that would start propagation of the crack (step 201). Then an ultrasound wave is applied to the crack tip 107 by the ultrasound source 103 to provide enough stress to overcome the critical value (step 203). As a result, the crack propagates through the material 101 (step 205). Since the total stress applied is just above the critical value, a small amount of energy can be used in terms of kinetic energy and the crack will propagate at a relatively low velocity.

The initial load L (as illustrated in FIG. 1) can be applied in different forms or ways. For example, in some implementations, the load L is applied as a mechanical load transverse to the crack propagation plane using weight or by mechanically pulling with the appropriate force to satisfy the stress conditions at the crack tip. In other implementations, the appropriate stress can be applied using thermal spalling where, upon cooling, the difference in contraction between two materials creates the propagation of the crack. In yet other implementations, the initial load L is applied by using a high frequency ultrasound source directed at the crack tip. This additional ultrasound source creates an appropriate stress condition at the crack tip to bring the material to just below the critical point.

Alternatively, the initial load could be applied to obtain a stress that is just above a critical value for the material 101. This initial stress causes spontaneous crack propagation in the material 101. The ultrasound source 103 is then controlled to modulate the stress at the crack tip to remain at a value just above the critical value.

FIG. 3 illustrates one example of a control system for performing the ultrasound-induced crack propagation using the method of FIG. 2 in the system of FIG. 1. The control system includes a controller 301 such as an electronic processor. The controller 301 accesses and executes instructions stored on a memory 303 in order to control the operation of the system. The controller 301 is also communicatively coupled to the ultrasound source 305 to regulate the frequency and amplitude of the generated ultrasound waves. In some implementations, the ultrasound source 305 is configured to activate a piezoelectric or transducer component that, in turn, transmits an ultrasound wave into the material (e.g., a silicon substrate) using a contact or non-contact operation mode. In some implementations, the controller 301 is also communicatively coupled to a second load source 307 such as, for example, a second ultrasonic source or a mechanical stress mechanism configured to controllably apply the initial load.

In some embodiments, such as illustrated in FIG. 1, an initial crack is made in the material. This initial crack is made on the side of the substrate at the height where the cleaving is to be performed. The indentation is sharp in order to reduce the stress needed to start propagation. The initial crack can be made using a diamond pen or nanoindentator to achieve a sufficient and appropriate level of sharpness in the crack. In other implementations and for certain types of materials, a laser could be used as indentator. In some implementations, no initial crack is made. However, in such implementations, the stress needed to start a crack propagation is generally higher and the crack may start close to the center of the sample and propagate outwards until it reaches the edges of the sample.

After crack propagation begins, the speed and direction of the crack propagation can be regulated by controlling the amplitude and frequency of the ultrasonic waves and, in some implementations, the position of the ultrasound source. The frequency is controlled to provoke tensile stress at the crack tip such that the acoustic frequency causes bonds in the crack plane to oscillate and stretch. The amplitude is set to create a focalized stress center at the crack tip, which ultimately controls the speed of crack propagation.

Even though the system is able to control the propagation of the crack through the material, in some implementations, the interaction of reflected waves with the crack tip could cause undesirable or uneven results. In order to prevent this, mitigating measures are applied to prevent the waves emitted by the crack tip and by the ultrasound source from being reflected back into the material when they reach the edges of the specimen. In some implementations, this is achieved by backing the solid with a damping or absorbing material of an appropriate acoustic impedance. As such, when the waves reach the edge of the solid, they are transmitted into the absorbing materials and completely damped. Consequently, no waves are reflected back to the material that could alter smooth propagation of the crack. Because the reflected wave's frequency will depend on the velocity of the crack and the properties of the solid such as the elastic modulus, the type of damping material may vary for different types of solids.

Figure 4A:
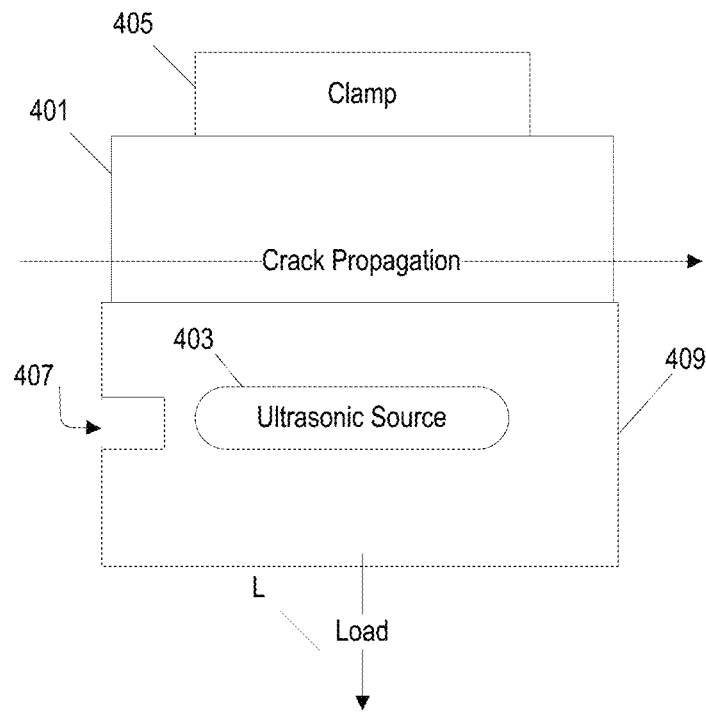
FIG. 4A is a schematic side-view of the system of FIG. 1 where the substrate is at least partially covered with an acoustic absorbing material.
Figure 4B:
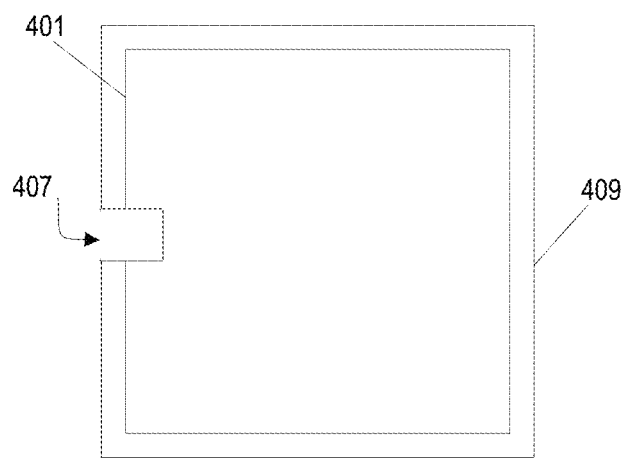
FIG. 4B is a schematic top-view of the system of FIG. 4A.

FIGS. 4A and 4B illustrate an example of a system that uses an absorbing material coating covering the material to be cracked in order to dampen reflected waves. Similar to the examples discussed above, an ultrasonic source 403 is operated to apply ultrasonic waves to the material 401. A clamp 405 holds the material 401 in place and an initial crack 407 has been cut into the material. However, unlike in the example of FIG. 1, the material 401 is partially coated with an absorbing material 409. A load L is applied to bring the material close to the critical point and then the ultrasonic source 403 is controllably used to propagate the crack through the material in the direction illustrated in FIG. 4A. As illustrated in FIG. 4A, the material 401 to be cracked is only partially covered by the absorbing material 407 in such a way that the material to be cracked 401 is completely coated in the plane of the crack. As illustrated in the top view of FIG. 4B, the absorbing material 407 completely surrounds the perimeter of the material 401 to be cracked in the plane of the crack. However, in some other implementation, the material 401 can be entirely coated with the absorbing materials 407 or other configurations and placements of the coating material 407 might be applied to the material 401 to be cracked.

Figure 5:
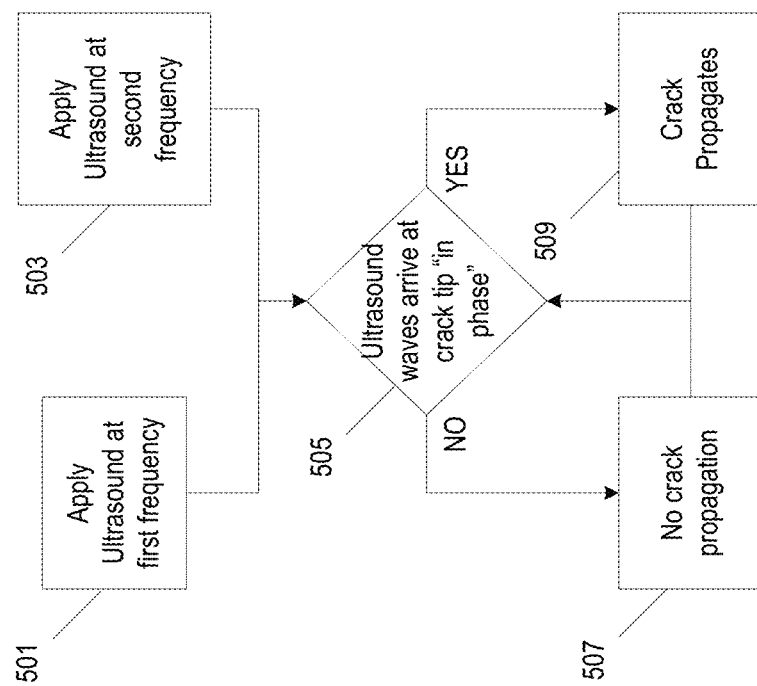
FIG. 5 is a flowchart of a method for ultrasound-induced crack propagation using a start-stop technique for control crack propagation.
Figure 7:
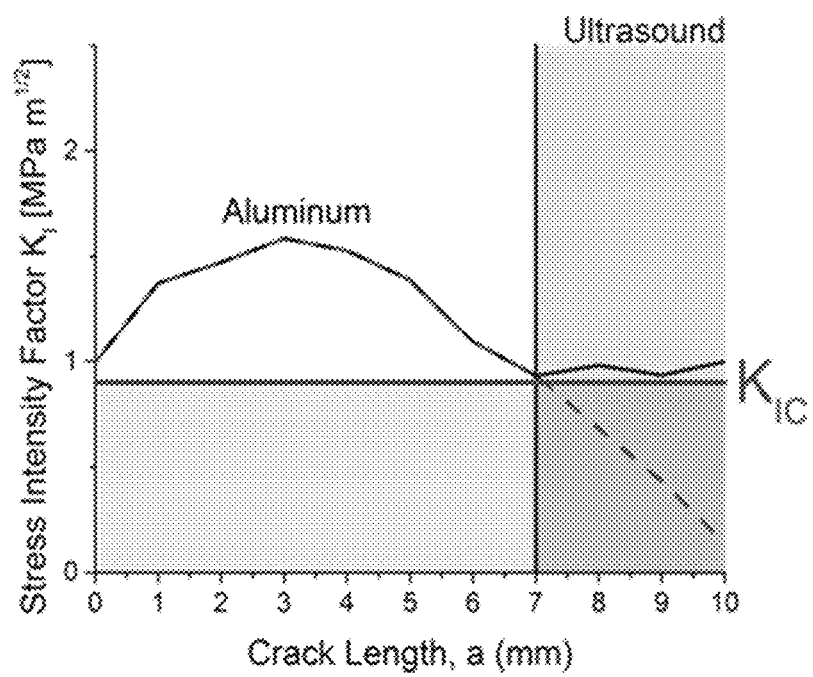
FIG. 7 is a graph of stress intensity as a crack propagates through a material where ultrasound waves are applied to regulate the stress intensity after crack propagation begins.

The propagation of the crack can be regulated in a number of different ways using the ultrasonic source. FIG. 5 illustrates one method of using two different ultrasonic sources—each operating at a different frequency—in order to regulate cracking in a "stop-start" manner. A first ultrasound wave is applied to the crack tip at a first frequency (step 501) and a second ultrasound wave is applied to the crack tip at a second frequency (step 503). The amplitude and frequency of these two ultrasound waves are controlled such that the crack growth is promoted when the ultrasound waves arrive at the crack tip in phase. While the two ultrasound waves remain out of phase (step 505), the cracking is not prompted and may slow or stop (step 507). However, when the two ultrasound waves are applied to the crack tip "in phase" (step 505), the crack propagates further (step 509). Because the ultrasound waves are applied at different frequencies, they are only "in phase" occasionally. Therefore, the energy at the tip decreases fast after initiation and the crack decelerates or even stops before uncontrollable crack motion begins. Repetition of this procedure can controllably propagate the crack through the entire material.

It is noted that the flowchart presented in FIG. 5 is not necessarily a representation of instructions executed by a controller in order to operate the system during the cracking process. Instead, FIG. 5 uses the flowchart format to illustrate how the material responds to the controlled application of the two ultrasound waves. The controller operates the ultrasound sources to apply two different ultrasound waves at two different, controlled frequencies. When the frequencies waves happen to align (i.e., arrive at the crack tip "in phase"), then the material will respond by cracking in an intermittent "stop-and-start" manner.

Figure 6:
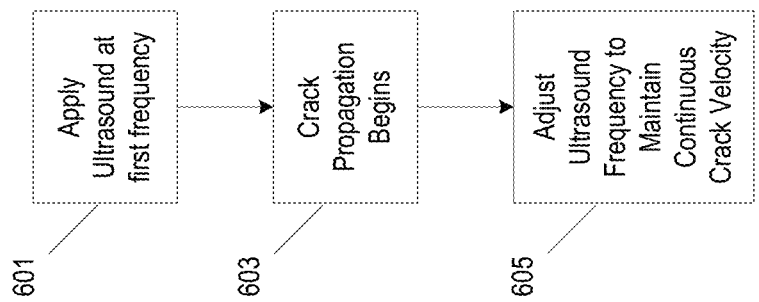
FIG. 6 is a flowchart of a method for ultrasound-induced crack propagation using a continuous crack propagation control technique.

FIG. 6 illustrates another method that achieves a more uniform, continuous propagation of the cracking. A first ultrasound is applied to the crack tip at a high frequency (step 601). This high-frequency applies stress to the crack tip, but it is insufficient to propagate the crack. A second ultrasound source is then applied at a lower frequency providing enough stress to start the propagation of the crack (step 603). However, as the crack propagates, the frequency and other parameters are adjusted in order to maintain a constant crack velocity (step 605). In this way, the ultrasound sources can be used to initiate the crack at low velocity and are then varied in order to keep the crack motion and K-values (as discussed below) within certain defined limits. In some implementations, the continuous approach utilizes an initial ultrasound wave or load to obtain a stress just above the critical value. Then, after the crack propagation has begun, another ultrasound source is applied and adjusted to maintain the constant crack velocity by adjusting the frequency and other parameters as the crack propagates.

Finally, the table below illustrates examples of values determined for different materials as glass, silicon, or sapphire. In these examples, equation (1) below can be used for the critical stress necessary to start a crack propagation:

$$\sigma_C = \left(\frac{2E\gamma}{\pi a}\right)^{1/2} \quad (1)$$

where E=Young modulus; γ=Surface energy; a=Initial crack length.

TABLE 1

|  | E (GPa) | γ (J/m$^2$) | a (μm) | $\sigma_C$(MPa) |
| --- | --- | --- | --- | --- |
| Glass | 7-17 | 0.3-4.4 | 70 | 5-20 |
| Silicon <100> | 130 | 2.16 | 70 | 50 |
| Sapphire | 335 | 6-40 | 70 | 135-350 |

In some implementations, the surface roughness of the material at the location of the propagated crack depends not only on the velocity of the propagating crack but also on the value of the stress intensity factor, K. The stress intensity factor is indicative of a state of the stress field around a propagating crack tip and it can be modeled using finite element analysis, FEA. As the crack propagates, the K values can go below a critical value, $K_{IC}$, and arrest the crack front. Low-roughness areas will be produced on the material surface where the K-value is only slightly above the critical value $K_{IC}$. Therefore, in some implementations, a substantially uniform, low-roughness surface can be created by operating the ultrasound source to maintain a difference be K-value and the $K_{IC}$ that is as low as possible.

Figure 8:
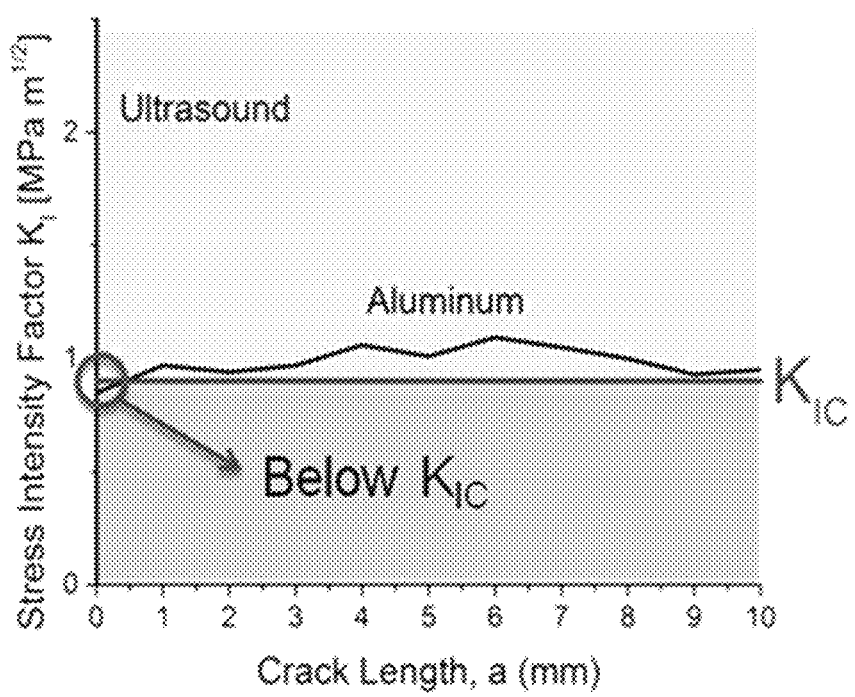
FIG. 8 is a graph of the stress intensity as a crack propagates through a material where ultrasounds waves are applied to initiate the crack propagation and to regulate the stress intensity after the crack propagation begins.

FIGS. 8 and 9 illustrate two examples of techniques for controlling an ultrasound source to produce a low-roughness surface. In both examples, finite element analysis FEA is used to control a spalling process in silicon for different solutions. In the example of FIG. 8, an initial stress is applied to initiate propagation of the crack and an ultrasound source is controlled to maintain a K-value above the critical value after the crack was already initiated. In the example of FIG. 9, an initial stress is applied to place the stress just below the $K_{IC}$-value and the ultrasound source is controlled to bring the K-value just above $K_{IC}$. As such, application and modulation of the ultrasound source initiates the crack propagation and controls the crack propagation for the entire cleaving process.

After the crack starts propagating, the speed of the crack accelerates until it reaches a constant value or is decelerated (either naturally or due to modulation applied by the ultrasound source). In some implementation, this acceleration is not desired because, as discussed above, a constant velocity provides a smoother surface at the crack. Accordingly, in some implementations, the controller is configured to operate the ultrasound source to maintain a crack velocity within certain defined limits and to maintain a K-value that is slightly above the $K_{IC}$. Applying ultrasound waves with higher frequencies will provide a higher effect on the propagation than those ultrasound waves at lower frequencies. Also, the effect that the ultrasound wave will have on the crack propagation can vary depending on the position of the ultrasound source with respect to the crack tip. Accordingly, in some such implementations, the velocity, stress intensity, and trajectory of the crack propagation can be regulated by controllably adjusting parameters of the ultrasound waves including, for example, the frequency, amplitude, shape, and power.

Thus, the invention provides, among other things, a system and method for wafering a material (such as glass, silicon, or sapphire) using controlled crack propagation by applying sound waves. Various features and advantages of the invention are set forth in the following claims.

What is claimed is:

1. A method of wafering a material using controlled crack propagations, the method comprising:

applying a first stress to the material such that the first stress is above a critical stress point of the material and initiates cracking of the material;

applying a controlled ultrasound wave to the material to maintain a total stress applied at a crack tip in the material slight above the critical stress point; and adjusting at least one parameter of the controlled ultrasound wave to maintain a substantially constant crack velocity, wherein the at least one parameter is selected from a group consisting of a frequency of the controlled ultrasound wave and an amplitude of the controlled ultrasound wave.

2. The method of claim 1, further comprising adjusting the controlled ultrasound wave to maintain a stress intensity K that is slightly above a critical stress intensity $K_{IC}$ of the material.

3. The method of claim 1, wherein applying a controlled ultrasound wave includes:

applying a first ultrasound wave at a first frequency; and applying a second ultrasound wave at a second frequency, wherein, when the first ultrasound wave and second ultrasound wave periodically align to be applied at the crack tip in phase.

4. The method of claim 1, further comprising applying a dampening material to an exterior surface of the material in order to absorb acoustic waves generated by the cracking of the material.

5. The method of claim 1, wherein applying a first stress includes applying a mechanical stress on the material in a direction perpendicular to the direction of the applied ultrasound wave.

6. The method of claim 5, wherein applying the mechanical stress on the material includes applying a weight to the material.

7. The method of claim 5, wherein applying the mechanical stress on the material includes pulling the material in a direction perpendicular to the direction of the applied ultrasound wave.

8. The method of claim 1, wherein applying the first stress includes regulating a temperature of the material to cause thermal spalling in the material.

9. The method of claim 1, wherein applying a first stress includes applying an ultrasound wave.

10. A method of wafering a material using controlled crack propagations, the method comprising:

applying a first stress to the material such that the first stress is above a critical stress point of the material and initiates cracking of the material;

applying a controlled ultrasound wave to the material to maintain a total stress applied at a crack tip in the material slight above the critical stress point;

wherein applying the controlled ultrasound wave includes:

applying a first ultrasound wave at a first frequency, and applying a second ultrasound wave at a second frequency, wherein, when the first ultrasound wave and second ultrasound wave periodically align to be applied at the crack tip in phase.

11. The method of claim 10, further comprising adjusting the controlled ultrasound wave to maintain a stress intensity K that is slightly above a critical stress intensity $K_{IC}$ of the material.

12. The method of claim 10, further comprising applying a dampening material to an exterior surface of the material in order to absorb acoustic waves generated by the cracking of the material.

13. The method of claim 10, wherein applying a first stress includes applying a mechanical stress on the material in a direction perpendicular to the direction of the applied ultrasound wave.

14. The method of claim 13, wherein applying the mechanical stress on the material includes applying a weight to the material.

15. The method of claim 13, wherein applying the mechanical stress on the material includes pulling the material in a direction perpendicular to the direction of the applied ultrasound wave.

16. The method of claim 10, wherein applying the first stress includes regulating a temperature of the material to cause thermal spalling in the material.

17. The method of claim 10, wherein applying a first stress includes applying an ultrasound wave.

* * * * *